US011264996B1

(12) United States Patent
Nakamura (10) Patent No.: US 11,264,996 B1
(45) Date of Patent: Mar. 1, 2022

(54) DIGITAL PLL CIRCUITRY (71) Applicants: KABUSHIKI KAISHA TOSHIBA, Tokyo (JP); TOSHIBA ELECTRONIC DEVICES & STORAGE CORPORATION, Tokyo (JP)

(72) Inventor: Tetsuya Nakamura, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/175,247

(22) Filed: Feb. 12, 2021

(30) Foreign Application Priority Data

Aug. 25, 2020 (JP) .............................. JP2020-141784

(51) Int. Cl.
*H03L 7/099* (2006.01)
*G06F 1/08* (2006.01)

(52) U.S. Cl.
CPC .............. *H03L 7/0991* (2013.01); *G06F 1/08* (2013.01)

(58) Field of Classification Search
CPC combination set(s) only.
See application file for complete search history.

(56) References Cited

U.S. PATENT DOCUMENTS

| 8,515,374 | B2* | 8/2013 | Dan | ...................... H03L 7/1075 455/255 |
| 10,637,484 | B2* | 4/2020 | Sudo | ..................... H03B 5/368 |
| 2012/0286835 | A1* | 11/2012 | Yamada | .................... H03L 1/00 327/156 |
| 2014/0266346 | A1* | 9/2014 | Park | ........................ H03L 7/095 327/158 |
| 2014/0266355 | A1* | 9/2014 | Park | ........................ H03L 7/095 327/159 |

(Continued)

FOREIGN PATENT DOCUMENTS

| JP | 2003318728 A | 11/2003 |
| JP | 2013081084 A | 5/2013 |
| WO | 2011001652 A1 | 1/2011 |

*Primary Examiner* — Adam D Houston
(74) *Attorney, Agent, or Firm* — Kim & Stewart LLP (57) ABSTRACT

A digital PLL circuitry, according to the present embodiment, includes: a phase difference arithmetic circuitry configured to arithmetically operate and output a phase difference between an input clock signal and an output clock signal; a first control code generation circuitry configured to generate a first control code for controlling an oscillation frequency based on the phase difference and a frequency control input being a control target frequency relating to the output clock signal, and output the first control code; a second control code generation circuitry configured to generate and output a second control code for controlling the oscillation frequency according to a sequence; a selection circuitry configured to select and output one of the first control code and the second control code as a selection control code; and a digitally controlled oscillator configured to output the output clock signal of the oscillation frequency according to the selection control code.

8 Claims, 7 Drawing Sheets

(56) References Cited

U.S. PATENT DOCUMENTS

| | | | |
|---|---|---|---|
| 2015/0222276 A1* | 8/2015 | Milijevic | H03L 7/0991 327/147 |
| 2016/0204787 A1* | 7/2016 | Lotfy | H03L 7/0992 327/142 |
| 2018/0123537 A1* | 5/2018 | Salle | H03L 7/08 |
| 2021/0111727 A1* | 4/2021 | Pahkala | H03L 7/08 |

* cited by examiner

DIGITAL PLL CIRCUITRY

CROSS-REFERENCE TO RELATED APPLICATIONS

This application is based upon and claims the benefit of priority from Japanese Patent Application No. 2020-141784, filed on Aug. 25, 2020; the entire contents of which are incorporated herein by reference.

FIELD

Embodiments of the present invention relate to a digital PLL circuitry.

BACKGROUND

Conventionally, in a semiconductor integrated circuitry, a PLL (Phase Locked Loop) circuitry is used for generating a clock signal of a desired frequency. An analog PLL circuitry in which the PLL circuitry is composed of an analog circuitry is the mainstream until now, but a digital PLL circuitry in which the PLL circuitry is composed of a digital circuitry has been developed accompanying the miniaturization of the CMOS technology. In particular, a digital PLL circuitry in which all of analog circuits are replaced with digital circuits is called an all digital PLL (All Digital Phase Locked Loop) circuitry.

The digital PLL circuitry includes a digitally controlled oscillator. At the startup of the digital PLL circuitry including the digitally controlled oscillator, an overshoot of an oscillation frequency depending on the startup characteristic of the digitally controlled oscillator occurs. However, if the overshoot of the oscillation frequency occurs in the clock signal oscillated by the digitally controlled oscillator, various problems occur. One of the problems is the necessity of an excessive STA (Static Timing Analysis) constraint margin when designing the digital PLL circuitry. This is because the maximum frequency of the digital PLL circuitry needs to be designed based on the PVT (Process-Voltage-Temperature) condition in consideration of the variation in manufacturing process (P) and the variations in voltage (V) and temperature (T) under a use environment.

The other of the problems is an increase in man-hour regarding the analog design at the circuitry design due to the suppression of the overshoot at the startup of the digital PLL circuitry to a realistic range. In addition to the two problems in terms of design, a problem relating to the operation characteristic of the digital PLL circuitry also occurs. That is, when the overshoot amount of the oscillation frequency of the digitally controlled oscillator becomes large, the time until the clock signal output from the digital PLL circuitry reaches a control target frequency increases, and therefore the lock-up time when the error of the oscillation frequency falls within an allowable range comes to increase.

DETAILED DESCRIPTION

Digital PLL circuitry according to embodiments will now be explained with reference to the accompanying drawings. Note that in the following explanation, the same reference numbers are given to components having substantially the same functions and configurations, and duplicate explanation will be made when it is necessary.

First Embodiment

A digital PLL circuitry according to a first embodiment is configured such that a control code to be input into a digitally controlled oscillator at the startup of the digital PLL circuitry is fixedly controlled by a sequence irrespective of the oscillation frequency of an output clock signal to be output from the digitally controlled oscillator to thereby suppress an overshoot of the oscillation frequency of the output clock signal. Its details will be explained below.

Figure 1:
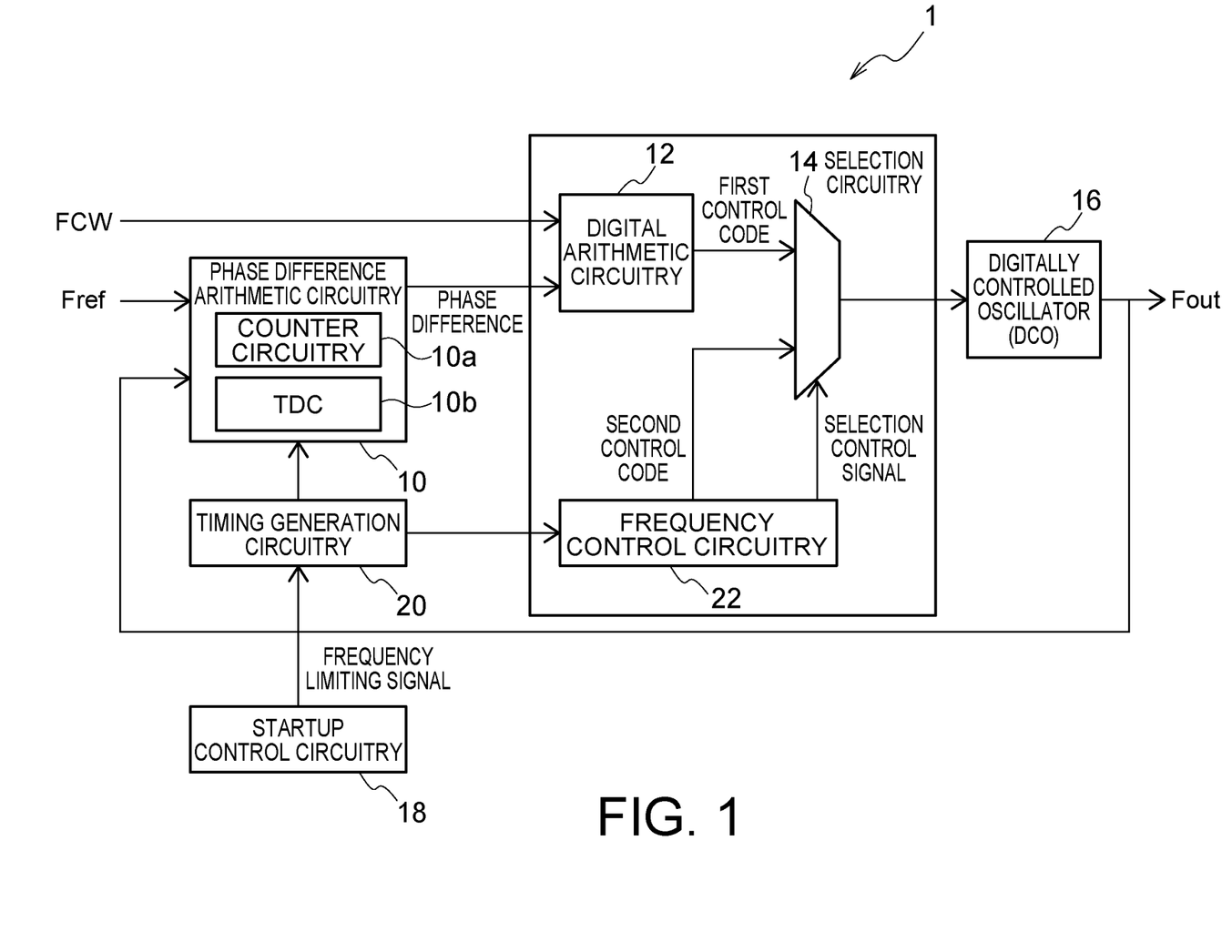
FIG. 1 is a block diagram explaining a configuration of a digital PLL circuitry according to a first embodiment.

FIG. 1 is a block diagram explaining a configuration of a digital PLL circuitry 1 according to this embodiment. As illustrated in FIG. 1, the digital PLL circuitry 1 according to this embodiment is configured to include a phase difference arithmetic circuitry 10, a digital arithmetic circuitry 12, a selection circuitry 14, a digitally controlled oscillator 16, a startup control circuitry 18, a timing generation circuitry 20, and a frequency control circuitry 22. In this embodiment, the digital PLL circuitry 1 is configured as a part of a semiconductor integrated circuitry.

Into the phase difference arithmetic circuitry 10, an input clock signal Fref and an output clock signal Fout are input. The phase difference arithmetic circuitry 10 then arithmetically operates and outputs a phase difference between the input clock signal Fref and the output clock signal Fout. The input clock signal Fref is a reference oscillation signal to be input into the digital PLL circuitry 1, and is generated, for example, by a quartz oscillator included in the semiconductor integrated circuitry. The output clock signal is an output oscillation signal to be output from the digital PLL circuitry 1. As is apparent from the above, the digital PLL circuitry 1 according to this embodiment is a circuitry configured to convert the input clock signal Fref of a frequency F1 into an output clock signal of a frequency F2 higher than the frequency F1 and output the output clock signal.

Into the digital arithmetic circuitry 12, the phase difference arithmetically operated by the phase difference arithmetic circuitry 10 and a frequency control input FCW are input. The frequency control input FCW is a frequency that is a control target of the output clock signal Fout output from the digital PLL circuitry 1. The frequency control input FCW is also called a Frequency Command Word, and is a frequency that is a control target expressed by a digital value. The digital arithmetic circuitry 12 generates a first control code based on the frequency control input FCW and on the phase difference.

Specifically, the digital arithmetic circuitry 12 time-integrates the frequency control input FCW and converts the resultant into phase information. The digital arithmetic circuitry 12 then compares the calculated phase information and the phase difference arithmetically operated by the phase difference arithmetic circuitry 10, and generates the first control code for controlling the oscillation frequency of the digitally controlled oscillator 16. More specifically, the digital arithmetic circuitry 12 calculates the difference between a target frequency ratio between the input clock signal Fref and the output clock signal Fout, and, a frequency ratio between the input clock signal Fref and an actual output clock signal Fout, as the phase difference, and generates the first control code based on the phase difference. The digital arithmetic circuitry 12 constitutes a first control code generation circuitry in this embodiment.

Into the selection circuitry 14, the first control code generated by the digital arithmetic circuitry 12 is input, and a second control code output from the frequency control circuitry 22 is input. The second control code is also a control code for controlling the oscillation frequency of the digitally controlled oscillator 16. From the frequency control circuitry 22, a selection control signal is also input into the selection circuitry 14. The selection circuitry 14 outputs one of the input first control code and second control code, as a selection control code, under control of the selection control signal. The selection circuitry 14 can be composed of, for example, a 2-input 1-output multiplexer.

In this embodiment, at the startup of the digital PLL circuitry 1, namely, at the startup of the digital arithmetic circuitry 12, the selection control signal for causing the selection circuitry 14 to select the second control code is input. On the other hand, during a normal operation of the digital PLL circuitry 1, the selection control signal for causing the selection circuitry 14 to select the first control code is input. Therefore, the selection circuitry 14 outputs the first control code during the normal operation, and outputs the second control code at the startup.

To the digitally controlled oscillator 16, the selection control code output from the selection circuitry 14 is input. Even when the selection control code is the first control code and even when the selection control code is the second control code, the selection control code is a code for controlling the oscillation frequency of the digitally controlled oscillator 16. In other words, the selection control code is a digital value of designating the oscillation frequency of the digitally controlled oscillator 16. The digitally controlled oscillator 16 generates and outputs the output clock signal Fout of the oscillation frequency according to the input selection control code. The digitally controlled oscillator 16 can be composed of, for example, a DCO (Digitally Controlled Oscillator).

The output clock signal Fout output from the digitally controlled oscillator 16 is the output oscillation signal of the digital PLL circuitry 1. The output clock signal Fout is supplied to necessary portions of the semiconductor integrated circuitry in which the digital PLL circuitry 1 is formed, and feedback-input into the phase difference arithmetic circuitry 10. The phase difference arithmetic circuitry 10 then arithmetically operates and outputs the phase difference between the input clock signal Fref and the output clock signal Fout as explained above.

The phase difference arithmetic circuitry 10 is configured to include at least, for example, a counter circuitry 10a and a TDC (Time to Digital Converter) 10b. The counter circuitry 10a calculates an integer value showing how many times the frequency of the input clock signal Fref the frequency of the output clock signal Fout is. The TDC 10b calculates its decimal part. Then, by combining the calculated integer value and decimal part, the phase difference between the input clock signal Fref and the output clock signal Fout can be found.

Figure 2:
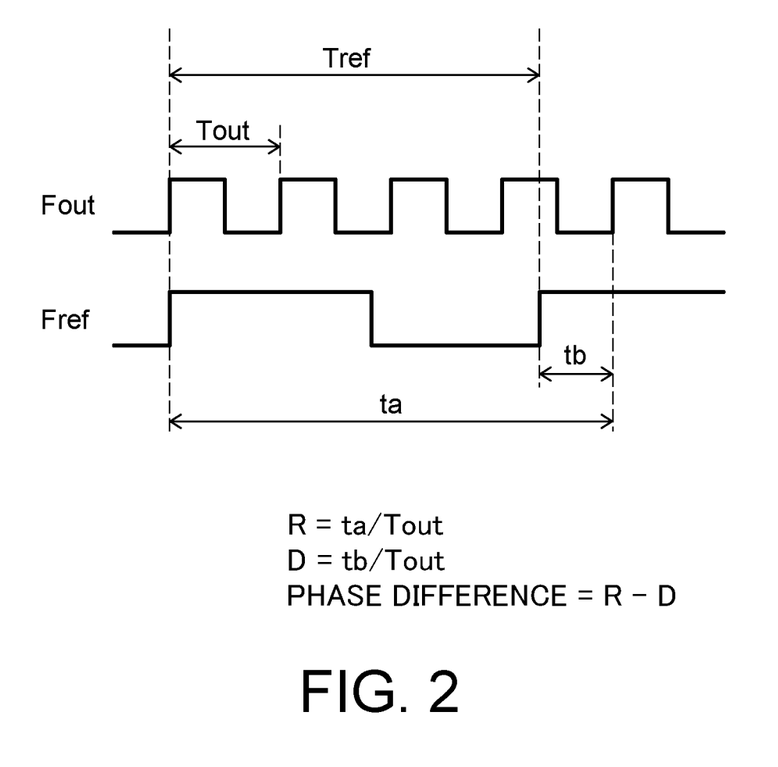
FIG. 2 is a chart illustrating examples of signal waveforms of an input clock signal and an output clock signal in the digital PLL circuitry in FIG. 1.

FIG. 2 is a chart illustrating examples of signal waveforms of the input clock signal Fref and the output clock signal Fout. As illustrated in FIG. 2, when it is assumed that a time of one cycle of the output clock signal Fout is Tout and a time of one cycle of the input clock signal Fref is Tref, the counter circuitry 10a which counts the number of clocks of the output clock signal Fout counts the number of clocks included in a time ta during the time Tref. Therefore, by the counting operation of the counter circuitry 10a, an integer value R=ta/Tout can be calculated. The integer value R represents an integer value showing how many times the frequency of the input clock signal Fref the frequency of the output clock signal Fout is.

Besides, when it is assumed that a difference between the time ta counted by the counter circuitry 10a and the time Tref of one cycle of the input clock signal Fref is tb, a decimal part D=tb/Tout can be calculated by the operation of the TDC 10b. Therefore, the phase difference arithmetically operated by the phase difference arithmetic circuitry 10 can be calculated by R−D. In other words, the phase difference arithmetic circuitry 10 calculates the frequency ratio between the frequency of the input clock signal Fref and the frequency of the actual output clock signal Fout, as the phase difference.

As is apparent from the above, the digital PLL circuitry 1 illustrated in FIG. 1 operates so that the frequency of the output clock signal Fout converges to the frequency designated by the frequency control input FCW. In other words, as illustrated in FIG. 1, into the digital PLL circuitry 1, the frequency control input FCW that is the control target frequency and the input clock signal Fref are input. The digital PLL circuitry 1 controls the oscillation frequency of the digitally controlled oscillator 16 so that the frequency of the output clock signal Fout becomes the frequency control input FCW, based on the input clock signal Fref. By feeding back the output clock signal Fout, the error between the frequency of the output clock signal Fout and the frequency control input FCW decreases while repeatedly fluctuating to the plus side and to the minus side, and it finally becomes the frequency designated by the frequency control input FCW.

Specifically, when the frequency of the output clock signal Fout is lower than the frequency control input FCW, the digital arithmetic circuitry 12 adjusts the first control code so that the frequency of the output clock signal Fout becomes high. On the other hand, when the frequency of the output clock signal Fout is higher than the frequency control input FCW, the digital arithmetic circuitry 12 adjusts the first control code so that the frequency of the output clock signal Fout becomes low.

Further, in the digital PLL circuitry 1 illustrated in FIG. 1, the startup control circuitry 18 outputs a frequency limiting signal to the timing generation circuitry 20 at the startup of the digital PLL circuitry 1. Specifically, the startup control circuitry 18 enables the frequency limiting signal and outputs it to the timing generation circuitry 20 when the digital PLL circuitry 1 is started up.

When the frequency limiting signal is enabled, the timing generation circuitry 20 instructs the frequency control circuitry 22 to start a startup sequence. The timing generation circuitry 20 further outputs a control signal for matching operation timings of the phase difference arithmetic circuitry 10 and the frequency control circuitry 22.

Upon receipt of an instruction to start the startup sequence, the frequency control circuitry 22 outputs the selection control signal for selecting the second control code to the selection circuitry 14, and the frequency control circuitry 22 conducts a control of increasing in stages, from a lower value, the oscillation frequency indicated by the second control code for controlling the oscillation frequency of the digitally controlled oscillator 16. The frequency control circuitry 22 constitutes a second control code generation circuitry according to this embodiment.

The frequency control circuitry 22 increases in stages the second control code up to, for example, a control code corresponding to the oscillation frequency at a predetermined height, and thereafter outputs the selection control signal for selecting the first control code to the selection circuitry 14. Thus, the digital PLL circuitry 1 completes the startup sequence and comes into a state of generating and outputting the normal output clock signal Fout having the control target frequency.

Alternatively, the frequency control circuitry 22 increases in stages the second control code up to, for example, a control code which may correspond to the control target frequency designated by the frequency control input FCW, and then outputs the selection control signal for selecting the first control code to the selection circuitry 14. Thus, the digital PLL circuitry 1 completes the startup sequence and comes into a state of generating and outputting the normal output clock signal Fout having the control target frequency. In this case, a schematic correspondence between the digital value of the frequency control input FCW and the control code corresponding thereto needs to be previously held in the frequency control circuitry 22.

Figure 3:
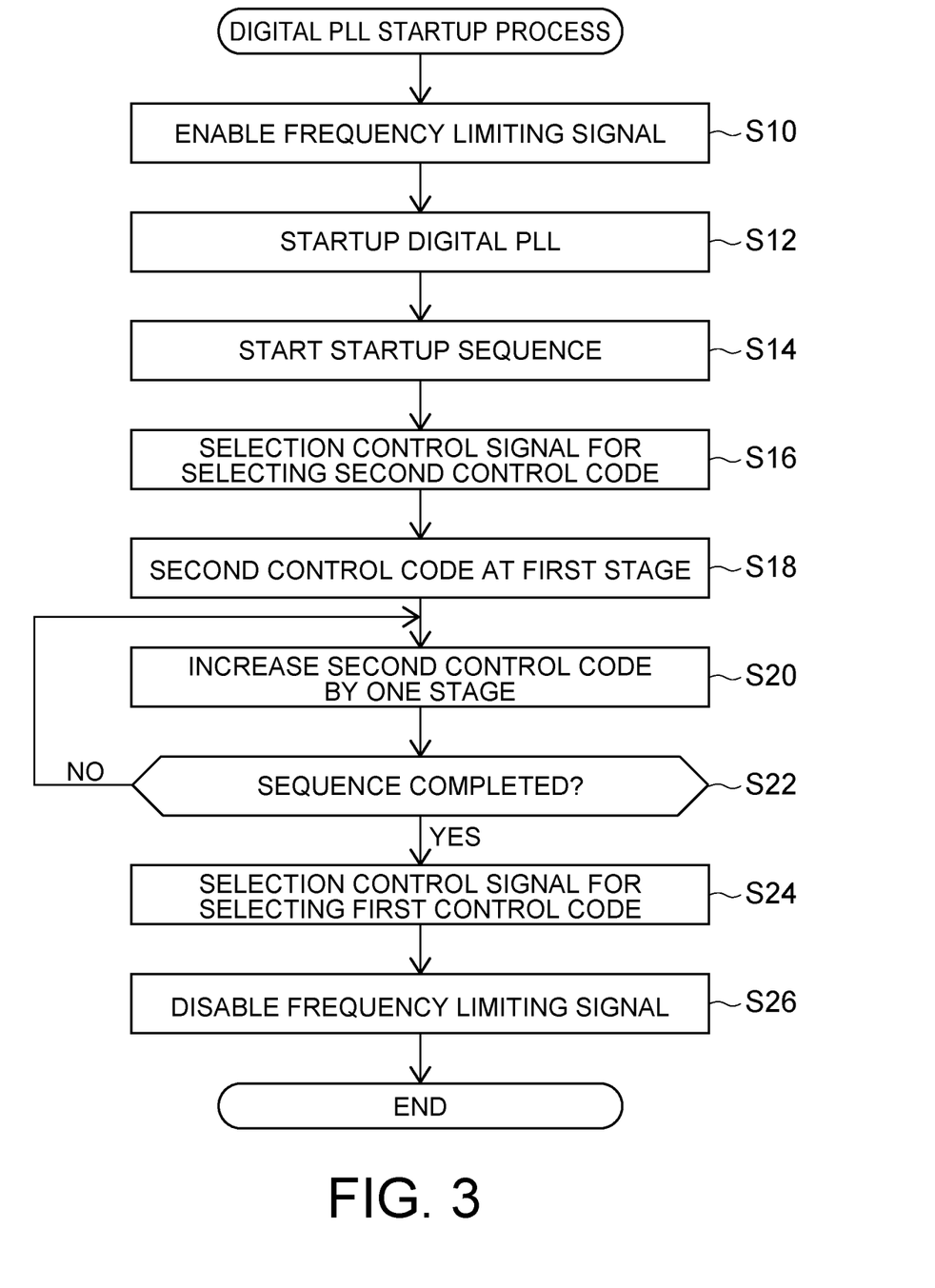
FIG. 3 is a diagram illustrating a flowchart explaining the content of a digital PLL startup process executed at the startup of the digital PLL circuitry illustrated in FIG. 1.

FIG. 3 is a diagram illustrating a flowchart explaining the content of a digital PLL startup process executed at the startup of the digital PLL circuitry 1 according to this embodiment. The digital PLL startup process is a process executed in the case where the digital PLL circuitry 1 is started up and receives an instruction to output the output clock signal Fout.

As illustrated in FIG. 3, upon start of the digital PLL startup process, the startup control circuitry 18 first enables the frequency limiting signal to be output to the timing generation circuitry 20 (Step S10). Subsequently, the startup control circuitry 18 starts up the digital PLL circuitry 1 (Step S12).

Next, the timing generation circuitry 20 received the enabled frequency limiting signal instructs the frequency control circuitry 22 to start the startup sequence (Step S14). The frequency control circuitry 22 instructed to start the startup sequence outputs the selection control signal for selecting the second control code to the selection circuitry 14 (Step S16). By outputting the selection control signal for selecting the second control code to the selection circuitry 14, a state as if the frequency control circuitry 22 takes over the control of the digitally controlled oscillator 16 by the digital arithmetic circuitry 12 is established.

Next, the frequency control circuitry 22 outputs the second control code corresponding to the oscillation frequency at the first stage to the selection circuitry 14 (Step S18). Thus, the digitally controlled oscillator 16 comes to generate and output the output clock signal Fout of the oscillation frequency according to the second control code.

Next, the frequency control circuitry 22 increases, after a lapse of a predetermined time, the second control code for controlling the oscillation frequency of the digitally controlled oscillator 16 by one stage (Step S20). The increment of the second control code can be decided arbitrarily according to the characteristics of the digitally controlled oscillator 16 and the digital PLL circuitry 1. For example, the frequency control circuitry 22 may output a second control code supposed to increase by 10 KHz as the oscillation frequency, or may output a second control code of increasing by 100 as a digital value of the second control code.

Next, the frequency control circuitry 22 determines whether the startup sequence has been completed (Step S22). As explained above, the frequency control circuitry 22 determines that the startup sequence has been completed, for example, when the second control code has been increased up to the control code corresponding to the oscillation frequency at the predetermined height or when the second control code has been increased up to the control code corresponding to the control target frequency designated by the frequency control input FCW.

When determining that the startup sequence has not been completed (Step S22: No), the frequency control circuitry 22 returns to Step S20, and increases the second control code of controlling the oscillation frequency of the digitally controlled oscillator 16 by one stage again after a lapse of a predetermined time. On the other hand, when determining that the startup sequence has been completed (Step S22: Yes), the frequency control circuitry 22 outputs the selection control signal for selecting the first control code to the selection circuitry 14 (Step S24). This makes the selection circuitry 14 select the first control code and output it as the selection control code, whereby a feedback control in the digital PLL circuitry 1 is started. In other words, a normal operation state is established in which the output clock signal Fout using the frequency control input FCW as the control target frequency is output.

Next, the startup control circuitry 18 disables the frequency limiting signal to be output to the timing generation circuitry 20 (Step S26). Thus, the digital PLL startup process according to this embodiment ends.

Note that during a period after the frequency control circuitry 22 outputs the selection control signal for selecting the second control code at Step S16 until the frequency control circuitry 22 outputs the selection control signal for selecting the first control code at Step S24, the arithmetical operation of the digital arithmetic circuitry 12 may be stopped. This is because the selection circuitry 14 selects and outputs the second control code as the selection control code during the period. This makes it possible to reduce the power consumption in the digital arithmetic circuitry 12.

Note that not the frequency control circuitry 22 but the startup control circuitry 18 may determine whether to complete the startup sequence, and may complete the digital PLL startup process. More specifically, when determining that the condition to complete the startup sequence is reached, the startup control circuitry 18 disables the frequency limiting signal. Upon receipt of the frequency limiting signal being disabled, the timing generation circuitry 20 may instruct the frequency control circuitry 22 to complete the startup sequence.

Figure 4A:
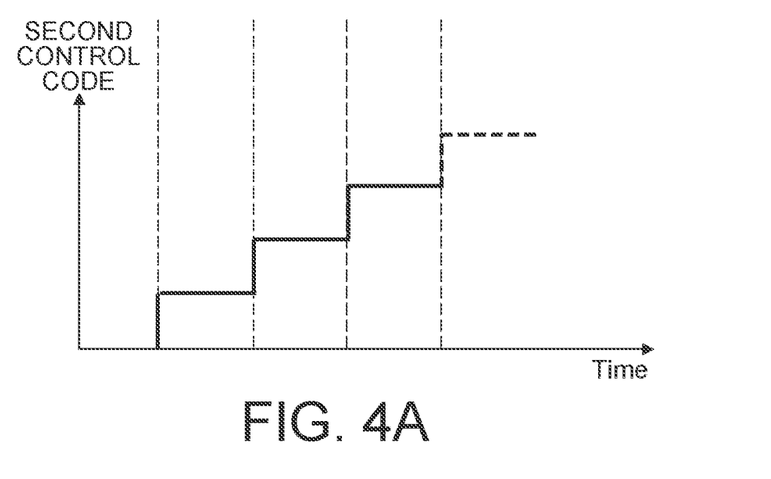
FIG. 4A is a chart illustrating a graph representing an example of a temporal change in a second control code in a startup sequence executed by the digital PLL circuitry illustrated in FIG. 1.
Figure 4B:
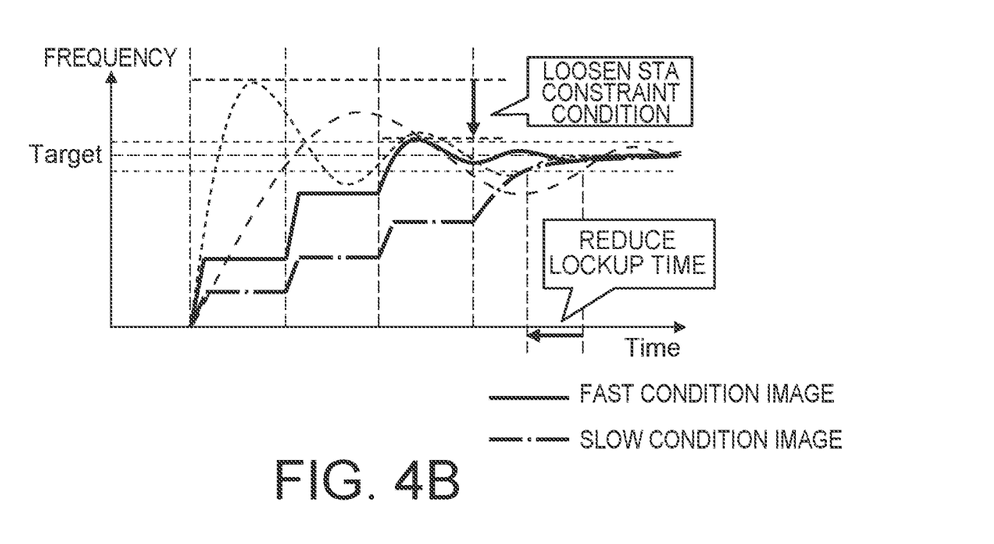
FIG. 4B is a chart illustrating a graph representing an example of a change in frequency of the output clock signal at a corresponding time to the chart in FIG. 4A.

FIG. 4A illustrates a graph representing an example of a temporal change in the second control code in the startup sequence, and FIG. 4B illustrates a graph representing an example of a change in frequency of the output clock signal Fout at that time.

As illustrated in FIG. 4A, when the startup sequence is started, the second control code output from the frequency control circuitry 22 increases in stages. During the increase, the selection control signal for selecting the second control code is output to the selection circuitry 14 from the frequency control circuitry 22. Therefore, the digitally controlled oscillator 16 generates the output oscillation signal of the oscillation frequency according to the second control code and outputs it as the output clock signal Fout.

As illustrated in FIG. 4B, with an increase in stages of the second control code, the frequency of the output clock signal Fout also increases in stages. When the frequency of the output clock signal Fout is increased up to the predetermined frequency, the selection control signal for selecting the first control code is output from the frequency control circuitry 22 to the selection circuitry 14. Therefore, the control is switched to the feedback control using the frequency control input FCW as the control target frequency, and the oscillation frequency of the output clock signal Fout converges to the frequency of the frequency control input FCW.

In this event, the frequency of the output clock signal Fout has been increased in stages up to the vicinity of the control target frequency, so that the overshoot when the control is switched to the feedback control is suppressed. In short, the overshoot of the frequency of the output clock signal Fout becomes small.

Figure 5:
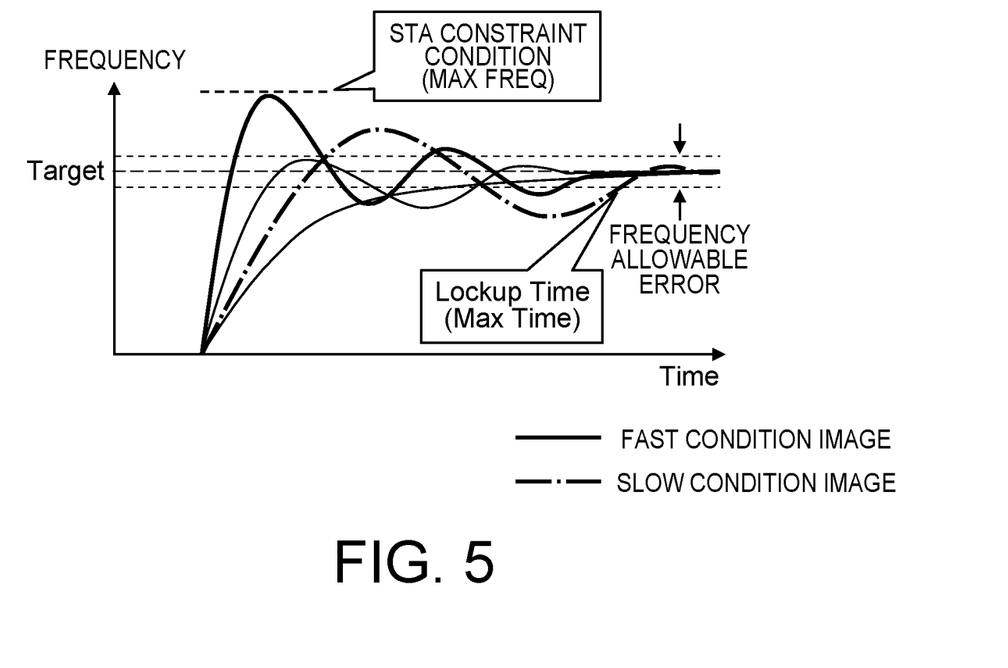
FIG. 5 is a chart illustrating a graph representing a temporal change in frequency of the output clock signal at the startup of a digital PLL circuitry in a comparative example.

FIG. 5 illustrates an example of a graph representing a temporal change in frequency of the output clock signal Fout at the startup of a digital PLL circuitry according to a comparative example. More specifically, the graph in FIG. 5 is the graph corresponding to FIG. 4B. In the digital PLL circuitry in the comparative example in FIG. 5, at the startup of the digital PLL circuitry, the increase in stages of the control code as in the above embodiment is not performed but the digital PLL circuitry is booted by a feedback control using the frequency control input FCW as the control target frequency. Therefore, the overshoot of the frequency of the output clock signal Fout becomes large, so that a large STA constraint margin is required when designing the digital PLL circuitry 1.

On the other hand, in the digital PLL circuitry 1 according to this embodiment, the control code is increased in stages up to the vicinity of the control target frequency as is apparent from FIG. 4, so that the overshoot of the frequency of the output clock signal Fout can be made small and the required STA constraint margin can be made small. This suppresses the overshoot at the startup to a realistic range, so that the increase in man-hour due to repeated analog design can be reduced. In other words, by reducing the excessive margin of the frequency due to the STA constraint, the cost and time required for circuitry design can be reduced. Furthermore, the design man-hours for suppressing the overshoot and instability at the startup of the digital PLL circuitry 1 can be reduced.

Further, as is apparent from the comparison between FIG. 4 and FIG. 5, the lock-up time being a time until the fluctuation in the output clock signal Fout falls within a range of a frequency allowable error can also be shortened. In other words, because the overshoot becomes small, the use of the output clock signal Fout becomes possible in a short time from when the digital PLL circuitry 1 is started up.

This results in that the lock-up time can be reduced irrespective of the variation in PVT condition. In other words, the lock-up time of the output clock signal Fout can be reduced even under the fast condition or even under the slow condition.

Note that in the digital PLL circuitry 1 illustrated in FIG. 1, the startup control circuitry 18, the timing generation circuitry 20, and the frequency control circuitry 22 are provided inside the digital PLL circuitry 1, but the circuitry is not necessarily provided inside the digital PLL circuitry 1. In other words, at least one of the startup control circuitry 18, the timing generation circuitry 20, and the frequency control circuitry 22 may be provided outside the digital PLL circuitry 1 and configured so that a signal or a command is input into the digital PLL circuitry 1 from the outside of the digital PLL circuitry 1.

Second Embodiment

A digital PLL circuitry 1 according to a second embodiment is configured such that when the startup of the digital PLL circuitry 1 according to the above first embodiment is completed and comes into the normal operation state, the digital PLL circuitry 1 is prevented from falling into a deadlock state by providing a limit to the maximum value of the control code to be input into the digitally controlled oscillator 16 according to the manufacturing variation. A portion different from the above first embodiment will be explained below.

Figure 6:
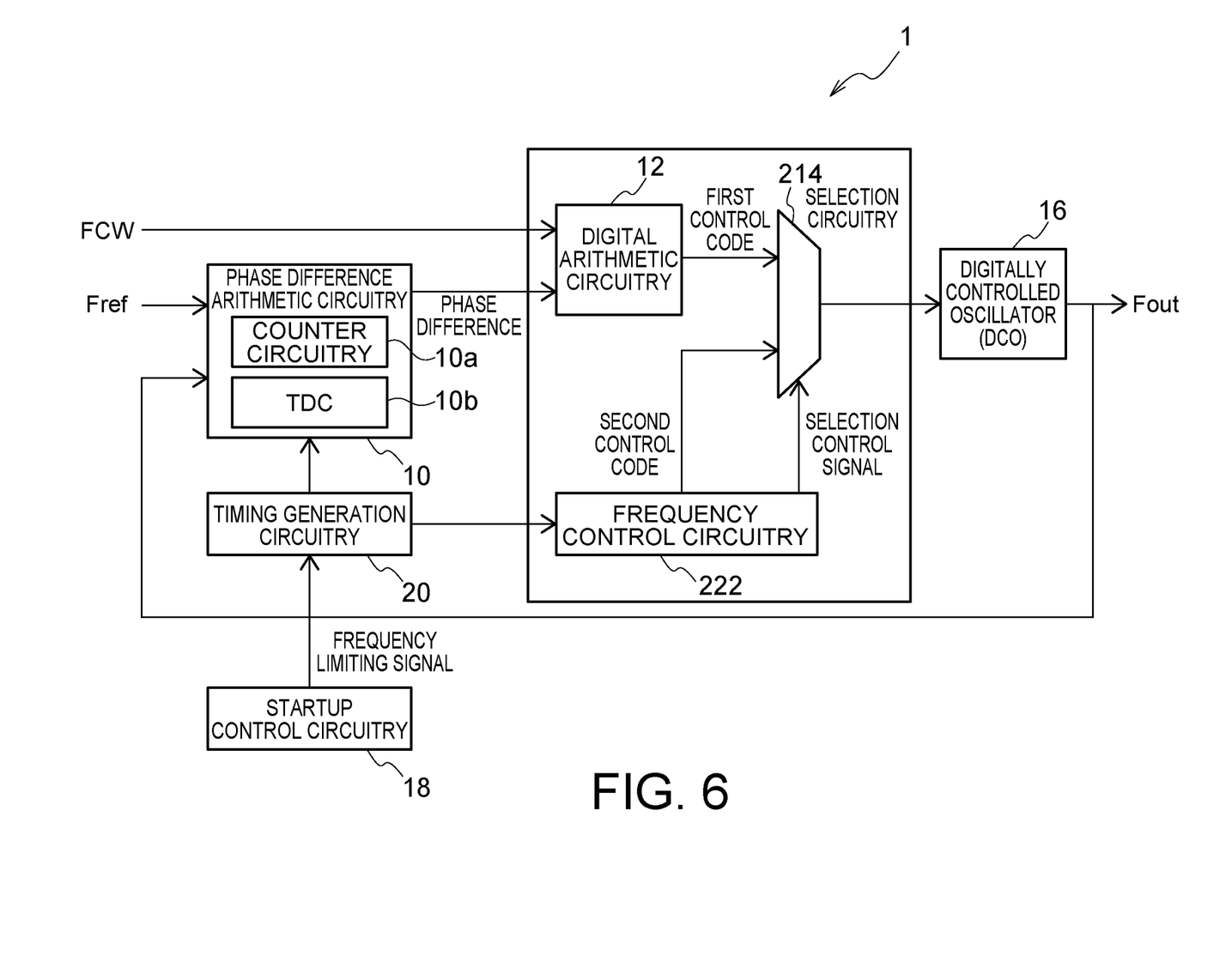
FIG. 6 is a block diagram explaining the configuration of a digital PLL circuitry according to a second embodiment.

FIG. 6 is a block diagram explaining the configuration of the digital PLL circuitry 1 according to this embodiment. As illustrated in FIG. 6, the basic configuration of the digital PLL circuitry 1 according to this embodiment is the same as that of the above first embodiment, but is different in functions of a frequency control circuitry 222 and a selection circuitry 214. More specifically, the frequency control circuitry 222 is a circuitry corresponding to the frequency control circuitry 22 in the first embodiment, and the selection circuitry 214 is a circuitry corresponding to the selection circuitry 14 in the first embodiment.

Also in the frequency control circuitry 222 of the digital PLL circuitry 1 according to this embodiment, the startup sequence until the digital PLL circuitry 1 reaches the normal operation state is the same as that in the above first embodiment. However, after the startup sequence of the digital PLL circuitry 1 is completed, the frequency control circuitry 222 outputs a selection control signal for selecting a lower selection control code of the first control code and the second control code, to the selection circuitry 214. In other words, the selection control signal to be output from the frequency control circuitry 222 takes a state of a control signal for selecting the second control code and a state of a control signal for selecting a lower one of the first control code and the second control code in this embodiment.

Then, the digital PLL circuitry 1 has come into the normal operation state, and the selection circuitry 214 into which the selection control signal for selecting the lower control code of the first control code and the second control code has been input selects the lower control code of the first control code input from the digital arithmetic circuitry 12 and the second control code input from the frequency control circuitry 222 under an instruction of the selection control signal, and outputs the lower control code as the selection control code to the digitally controlled oscillator 16. In other words, the digital value of the second control code input from the frequency control circuitry 222 becomes the maximum value of the digital value of the control code to be input into the digitally controlled oscillator 16.

Therefore, in the digital PLL circuitry 1 according to this embodiment, after the digital PLL startup process illustrated in FIG. 3 ends, the second control code output from the frequency control circuitry 222 takes the maximum value of the selection control code to be input into the digitally controlled oscillator 16. In other words, the oscillation frequency corresponding to the second control code becomes the maximum oscillation frequency of the digital PLL circuitry 1. In the digital PLL circuitry 1 according to this embodiment, the maximum oscillation frequency decided by the second control code is set to fall within the range of the STA constraint, to thereby prevent the digital PLL circuitry 1 from coming into the deadlock state in the normal operation state.

However, the range of the STA constraint may fluctuate due to the fluctuation in the PVT condition. Here, the range of the fluctuation in the STA constraint in the semiconductor integrated circuitry as one finished product depends on voltage (V) and temperature (T), but does not depend on the manufacturing process (P) because it has been already decided. Utilizing this characteristic, the condition of the manufacturing process (P) is estimated based on the control code which has been input into the digitally controlled oscillator 16 when the digital PLL circuitry 1 has fallen into the deadlock state, and the range of the STA constraint which may fluctuate depending on voltage (V) and temperature (T) is calculated. Then, based on the calculation result, the maximum value of the control code to be input into the digitally controlled oscillator 16 is set, and the maximum value is regarded as the second control code, namely, the maximum oscillation frequency in the normal operation state of the digital PLL circuitry 1.

Figure 7:
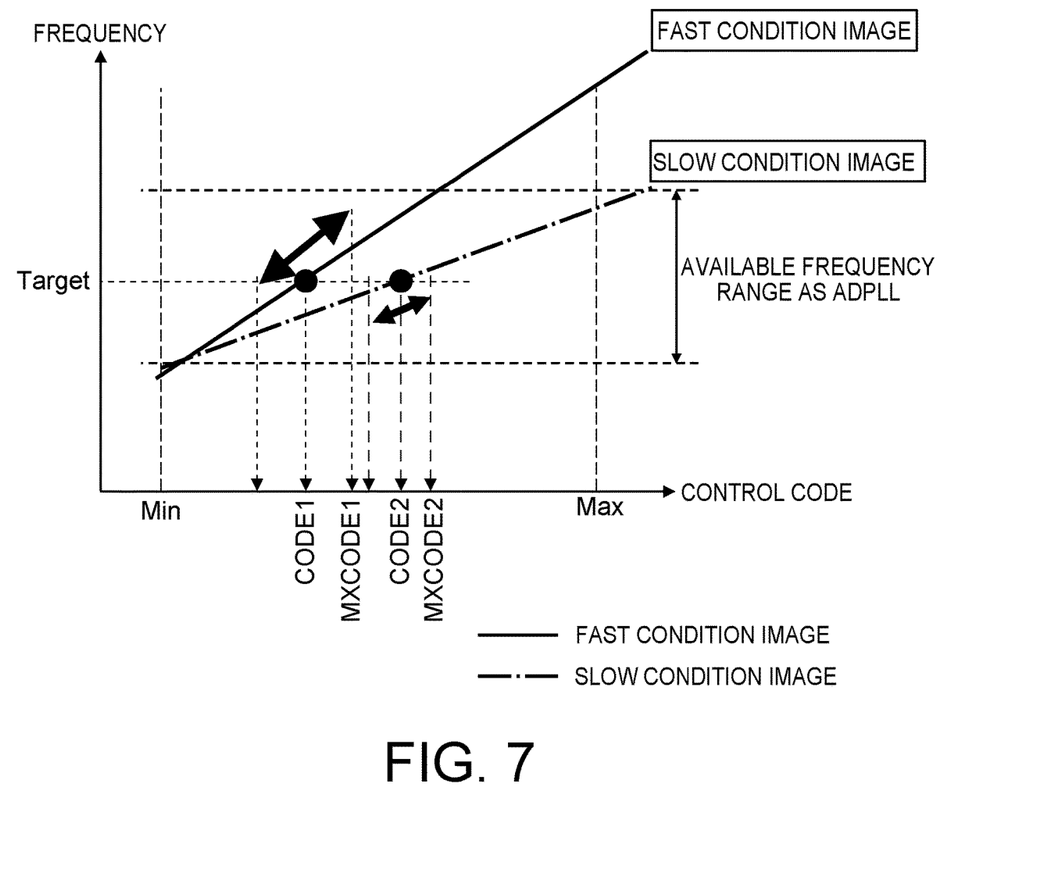
FIG. 7 is a chart illustrating a graph representing an example of the relation between a control code input into a digitally controlled oscillator of the digital PLL circuitry illustrated in FIG. 6 and the frequency of the output clock signal output from the digitally controlled oscillator.

FIG. 7 illustrates, for explaining the above, a graph representing an example of the relation between the control code input into the digitally controlled oscillator 16 and the frequency of the clock signal output from the digitally controlled oscillator 16, namely, the frequency of the output clock signal Fout. In FIG. 7, the solid line represents an example of the relation between the control code and the frequency in the case where the manufacturing process comes into the FAST condition, and the one-dotted chain line represents an example of the relation between the control code and the frequency in the case where the manufacturing process comes into the SLOW condition.

Under the FAST condition, the oscillation frequency of the digitally controlled oscillator 16 becomes the target frequency coinciding with the frequency control input FCW when the control code is CODE1. Therefore, the maximum value of the control code in consideration of the fluctuations in voltage (V) and temperature (T) of the digital PLL circuitry 1 becomes MXCODE1. The maximum value MXCODE1 of the control code is set in the frequency control circuitry 222, and is regarded as the maximum oscillation frequency of the digital PLL circuitry 1 in the normal operation state.

On the other hand, under the SLOW condition, the oscillation frequency of the digitally controlled oscillator 16 becomes the target frequency coinciding with the frequency control input FCW when the control code is CODE2. Therefore, the maximum value of the control code in consideration of the fluctuations in voltage (V) and temperature (T) of the digital PLL circuitry 1 becomes MXCODE2. The maximum value MXCODE2 of the control code is set in the frequency control circuitry 222, and is regarded as the maximum oscillation frequency of the digital PLL circuitry 1 in the normal operation state.

What condition the digital PLL circuitry 1 takes depends on the semiconductor integrated circuitry in which the digital PLL circuitry 1 is installed. Therefore, for example, the digital PLL circuitry 1 is once brought into the deadlock state, and it is estimated, based on the frequency of the digitally controlled oscillator 16 and the control code in the deadlock state, whether the digital PLL circuitry 1 is under the FAST condition, the SLOW condition, or a condition at what intermediate level between both the conditions. Then, based on the estimated result, the second control code in the normal operation state is set in the frequency control circuitry 222.

The second control code in the normal operation state may be set at an arbitrary timing in the frequency control circuitry 222. For example, when the digital value of the frequency control input FCW is changed, the second control code in the normal operation state may be set by an automatic sequence, or may be set in the factory in shipping of the semiconductor integrated circuitry in which the digital PLL circuitry 1 is installed.

As explained above, according to the digital PLL circuitry 1 according to this embodiment, even when the digital PLL circuitry 1 has completed the startup sequence and comes into the normal operation state, the maximum value of the frequency of the output clock signal Fout generated by the digital PLL circuitry 1 can be limited. Therefore, it is possible to prevent the digital PLL circuitry 1 from coming into the deadlock state. This can prevent the digital PLL circuitry 1 from coming into the deadlock state, when trying to generate the output clock signal Fout of a frequency exceeding the STA constraint due to the unexpected disturbance.

Note that also in the digital PLL circuitry 1 according to this embodiment, the digital PLL startup process illustrated in FIG. 3 is executed at the startup of the digital PLL circuitry 1 as in the above first embodiment, thus making it possible to suppress the overshoot of the frequency of the output clock signal Fout at the startup and reduce the lock-up time.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A digital PLL circuitry comprising:
    a phase difference arithmetic circuitry configured to arithmetically determine and output a phase difference between an input clock signal and an output clock signal;
    a first control code generation circuitry configured to generate a first control code for controlling an oscillation frequency based on both the phase difference and a frequency control input that is a control target frequency of the output clock signal, and further configured to output the first control code;
    a second control code generation circuitry configured to execute a sequence to generate and output a second control code for controlling the oscillation frequency;

a selection circuitry configured to:
  while the sequence of the second control code generation circuitry is being executed, select and output the second control code as a selection control code, and after execution of the sequence by the second control code generation circuitry ends, select and output the first control code as the selection control code; and
a digitally controlled oscillator configured to output the output clock signal at the oscillation frequency corresponding to the selection control code.

2. The digital PLL circuitry according to claim 1, wherein the sequence of the second control code generation circuitry is a startup sequence executed by the second control code generation circuitry at startup of the digital PLL circuitry.

3. The digital PLL circuitry according to claim 2, wherein according to the sequence of the second control code generation circuitry, the second control code is increased in stages upon the startup of the digital PLL circuitry.

4. The digital PLL circuitry according to claim 1, wherein whether the selection circuitry selects and outputs the first control code as the selection control code or selects and outputs the second control code as the selection control code is decided based on a selection control signal output from the second control code generation circuitry to the selection circuitry.

5. A digital PLL circuitry comprising:
  a phase difference arithmetic circuitry configured to arithmetically determine and output a phase difference between an input clock signal and an output clock signal;
  a first control code generation circuitry configured to generate a first control code for controlling an oscillation frequency based on both the phase difference and a frequency control input that is a control target frequency of the output clock signal, and further configured to output the first control code;
  a second control code generation circuitry configured to execute a sequence to generate and output a second control code for controlling the oscillation frequency;
  a selection circuitry configured to select and output one of the first control code and the second control code as a selection control code, wherein after execution of the sequence the second control code generation circuitry ends, the selection circuitry selects and outputs the lower one of the first control code and the second control code as the selection control code; and
  a digitally controlled oscillator configured to output the output clock signal at the oscillation frequency corresponding to the selection control code.

6. The digital PLL circuitry according to claim 5, wherein the selection control code selected and output after execution of the sequence by the second control code generation circuitry ends is decided based on a control code which has been input into the digitally controlled oscillator when the digital PLL circuitry has fallen into a deadlock.

7. The digital PLL circuitry according to claim 6, wherein whether the selection circuitry selects and outputs the second control code as the selection control code or selects and outputs the lower one of the first control code and the second control code as the selection control code is decided based on a selection control signal output from the second control code generation circuitry to the selection circuitry.

8. A digital PLL circuitry comprising:
  a phase difference arithmetic circuitry configured to arithmetically determine and output a phase difference between an input clock signal and an output clock signal;
  a first control code generation circuitry configured to generate a first control code for controlling an oscillation frequency based on both the phase difference and a frequency control input that is a control target frequency of the output clock signal, and further configured to output the first control code;
  a second control code generation circuitry configured to execute a startup sequence at startup of the digital PLL circuitry to generate and output a second control code for controlling the oscillation frequency;
  a selection circuitry configured to select and output one of the first control code and the second control code as a selection control code, wherein after the startup sequence of the second control code generation circuitry ends, the selection circuitry selects and outputs the lower one of the first control code and the second control code as the selection control code; and
  a digitally controlled oscillator configured to output the output clock signal at the oscillation frequency corresponding to the selection control code.

* * * * *